United States Patent
Yamamoto et al.

[11] Patent Number: 6,127,715
[45] Date of Patent: *Oct. 3, 2000

[54] PHOTODETECTOR ELEMENT CONTAINING CIRCUIT ELEMENT AND MANUFACTURING METHOD THEREOF

[75] Inventors: Motohiko Yamamoto, Ikoma-gun; Masaru Kubo, Kitakatsuragi-gun, both of Japan

[73] Assignee: Sharp Kabushiki Kaisha, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/685,676

[22] Filed: Jul. 24, 1996

[30] Foreign Application Priority Data

| Jul. 24, 1995 | [JP] | Japan | 7-187266 |
| May 27, 1996 | [JP] | Japan | 8-131856 |

[51] Int. Cl.[7] ............ H01L 31/00; H01L 31/12
[52] U.S. Cl. ............ 257/459; 257/81; 257/84; 257/444; 257/448
[58] Field of Search ............ 257/290, 432, 257/437, 448, 459, 751, 81, 82, 84, 444

[56] References Cited

U.S. PATENT DOCUMENTS

| 4,266,237 | 5/1981 | Hendrickson | 257/290 |
| 5,177,581 | 1/1993 | Kubo et al. | 257/437 |
| 5,216,491 | 6/1993 | Yamamoto et al. | 257/53 |
| 5,324,958 | 6/1994 | Mead et al. | 257/291 |
| 5,371,384 | 12/1994 | Wada | 257/82 |
| 5,416,359 | 5/1995 | Oda | 257/751 |
| 5,483,096 | 1/1996 | Kuhara | 257/462 |
| 5,488,251 | 1/1996 | Mizutani et al. | 257/557 |
| 5,502,335 | 3/1996 | Oda | 257/751 |
| 5,506,434 | 4/1996 | Yonemoto | 257/291 |
| 5,600,157 | 2/1997 | Abiko et al. | 257/84 |
| 5,663,598 | 9/1997 | Lake et al. | 257/737 |
| 5,665,639 | 9/1997 | Seppala et al. | 438/15 |

FOREIGN PATENT DOCUMENTS

| 59-134872 | 8/1984 | Japan |
| 5-013584 | 1/1993 | Japan |
| 5-29379 | 2/1993 | Japan |
| 5-198530 | 8/1993 | Japan |
| 7-70635 | 7/1995 | Japan |
| 7-321290 | 12/1995 | Japan |

*Primary Examiner*—Mahshid Saadat
*Assistant Examiner*—Allan R. Wilson

[57] ABSTRACT

$Si_3N_4$ having high humidity resistance is used as a surface protecting insulating film covering a metal layer. At a bonding pad portion where metal layer is directly exposed, coverage is provided by anti-corrosion metal portion consisting of a titanium-tungsten alloy layer and gold layers. At a signal processing circuit portion, light intercepting structure and interconnection are provided similarly by titanium-tungsten alloy layer and gold layer. Thus humidity resistance of a photodetector element containing a circuit element is improved, and the gold layer allows direct die-bonding of a laser chip or the like. Further, since light intercepting structure and interconnection can be provided at the signal processing circuit portion simultaneously with the formation of gold layer for the bonding pad portion, the number of manufacturing steps can be reduced.

14 Claims, 18 Drawing Sheets

PHOTODETECTOR ELEMENT CONTAINING CIRCUIT ELEMENT AND MANUFACTURING METHOD THEREOF

BACKGROUND OF THE INVENTION

1. Field of the Invention

The present invention relates to a photodetector element containing a circuit element and manufacturing method thereof. More specifically, the present invention relates to a photodetector element including a circuit element such as a signal processing circuit, used in an optical pickup, an optical remote controller or the like, and to the manufacturing method thereof.

2. Description of the Related Art

FIG. 13 is a schematic cross section showing a specific structure of a photodetector element including a circuit element in accordance with a first related art example.

Such a photodetector element including a circuit element has been widely used for an optical pickup, an optical remote controller or the like. The photodetector element containing a circuit element includes a bonding pad portion 21, a photodiode portion 22 for detecting the received light, and a signal processing circuit portion 23 for processing the received optical signal. The photodetector element containing a circuit element has a multilayered structure including a P type substrate 1, an N type epitaxial layer 5, an $SiO_2$ film 7, and a surface protecting insulating film 12 in this order from the bottom of the figure. At prescribed positions of p type substrate 1 and N type epitaxial layer 5, an N type buried diffusion layer 2, a P type buried isolating diffusion layer 3, a P type isolating diffusion layer 4, P type diffusion layer 6 and an N type diffusion layer 8 for forming a circuit are formed. Metal layers (aluminum layers, also referred to as metal interconnection portions) 9b to 9f extending at prescribed positions of $SiO_2$ film 7 are electrically connected to P type diffusion layer 6 or N type diffusion layer 8 mentioned above, and used for providing electrical interconnection on $SiO_2$ film 7. The surface of the photodetector element containing a circuit element including these metal layers 9b to 9f is covered by a surface protecting insulating film 12, so that direct exposure of metal layers 9b to 9f to the ambient air is prevented.

Further, a metal layer 9a is provided at bonding pad portion 21. At that portion of metal layer 9a which is in the bonding pad portion 21, the surface protecting insulating film 12 is not formed. Therefore, at metal layer 9a in bonding pad portion 21, electrical connection with the outside can be provided.

Such a photodetector element containing a circuit element is encapsulated in a transparent resin mold package, and used as an electronic component.

FIG. 14 is a schematic cross section showing a structure of a photodetector element including a circuit element in accordance with a second related art example.

In the photodetector element containing a circuit element in accordance with the first related art example, it is possible that optical carriers are generated in the silicon substrate because of light incident on the signal processing circuit portion 23, and that a parasitic current is caused by the generated optical carriers, resulting in malfunction of the circuit.

In the photodetector element containing a circuit element in accordance with the second related art example, in order to prevent this malfunction, an interlayer insulating film 10 is formed on the first metal layers 9a to 9f and on $SiO_2$ film 7, and a second metal layer 11 is formed at the portion of signal processing circuit 23 on interlayer insulating film 10. Protecting film 12 is formed on the second metal layer 11.

More specifically, in the photodetector element containing a circuit element in accordance with the second related art example, a two-layered interconnection structure comprised of the first metal layers 9d to 9f and the second metal layer 11 is used. Since the signal processing circuit 23 is covered with the second metal layer 11, light does not enter the signal processing circuit portion. Therefore, malfunction of the circuit caused by optical carriers can be prevented.

FIG. 15 is a schematic cross section showing a structure of a photodetector element containing a circuit element in accordance with a third related art example. In this example, the second metal layer 11 is used as an interconnection for the signal processing circuit.

FIG. 16 is a schematic cross section showing a structure of a photodetector element containing a circuit element in accordance with a fourth related art example. In this example, a surface anti-reflection film 17 of $Si_3N_4$ is formed at photodiode portion 22, which is the photodetector element.

In the above described embodiments, same reference characters denote the same or corresponding portions.

However, the above described photodetector elements containing circuit elements have the following disadvantages.

The photodetector element containing a circuit element in accordance with the first related art example is encapsulated in a transparent resin mold package. However, the transparent resin mold package is not humidity proof. Though the metal interconnections 9b to 9f of aluminum are covered with a protecting film 12, protecting film 12 formed of $SiO_2$ or polyimide resin has poor resistance to humidity. Therefore, there have been cases where aluminum constituting metal interconnection portions 9b to 9f are corroded by water permeated through the protecting film. Further, metal portion 9a at bonding pad portion 21 is not covered with the protecting film 12, and therefore corrosion is more likely.

In order to solve this problem, a possible solution is to use $Si_3N_4$ which is highly resistant to humidity for protecting film 12. In that case, corrosion of metal interconnection portions 9b to 9f can be prevented. However, bonding pad portion 21 is not covered with the protecting film 12, and hence corrosion could not be avoided.

Further, the process for manufacturing the photodetector element containing a circuit element in accordance with the second and third related art examples requires, in addition to the steps for manufacturing the photodetector element containing a circuit element in accordance with the first related art example, (1) the step of depositing interlayer insulating film 10, (2) the step of opening a through hole portion in interlayer insulating film 10, (3) the step of depositing a second metal layer 11, and (4) the step of patterning the second metal layer 11. Increase of the steps (1) to (4) cause increased time necessary for manufacturing the photodetector element containing a circuit element and hence increased manufacturing cost.

Further, in the field of optical pickup and the like, recently, a structure has been proposed in which a light emitting element such as a laser diode chip is directly die-bonded onto the photodetector element containing a circuit element, in order to reduce the size of the device. However, in the structures of the related art examples, there was not a solder material used for direct die-bonding of the laser diode chip, and hence the laser diode chip could not be directly die-bonded.

Further, in the fourth related art example shown in FIG. 16, a anti-reflection film of $Si_3N_4$ is formed on the photodiode, which is the photodetector element, in order to improve optical sensitivity of the photodetector element containing a circuit element. When the protecting film 12 is formed by $Si_3N_4$ in order to improve humidity resistance in such a structure, the following problem arises.

Referring to FIG. 16, $SiO_2$ film 7 at photodiode portion 22 which is the photodetector element has a hole, and a anti-reflection film 17 of $Si_3N_4$ is formed. In this structure, when $Si_3N_4$ is used as surface protecting film 12 with the surface protecting film 12 being stacked on anti-reflection film 17 on photodiode portion 22, surface reflectance varies as the thickness of anti-reflection film (corresponding to the total of the thicknesses of $Si_3N_4$ films 12 and 17) vary widely. Therefore, it becomes necessary to remove the surface protecting film 12 at the photodiode portion. However, at the time of etching the surface protecting film 12, $Si_3N_4$ film 17 is also etched simultaneously. Therefore, variation in the film thickness of the anti-reflection film is unavoidable.

In order to prevent the variation in film thickness, it is possible to perform the following process steps. First, referring to FIG. 17, when metal interconnection is formed at the signal processing circuit portion 23, a metal pattern 9 is left also on photodiode portion 22. Thereafter, referring to FIG. 18, $Si_3N_4$ film 10 which will be the interlayer insulating film is deposited, and a through hole is opened. Thereafter, the second interconnection layer of the signal processing circuit portion and a metal layer 11 which serves to intercept light are deposited, and patterned by common photolithography. Thereafter, surface protecting film 12 of $Si_3N_4$ is deposited, and photodiode portion 22 and bonding pad portion 21 are opened. At this time, since photodiode portion is protected by metal patterns 9 and 11, anti-reflection film 15 is not etched.

Thereafter, common photolithography is performed so that metal layers 9 and 11 on the photodiode are removed and the structure shown in FIG. 16 results.

Through the above described manufacturing steps, a photodetector element containing a circuit element which is humidity proof and in which variation in the thickness of reflection protecting film is suppressed, can be provided.

However, according to this process, it is necessary to add the step of photolithography to remove the metal layers on the photodiode, which increases cost. Further, the aluminum film is exposed at the bonding pad portion 21 in this structure, and hence at this portion, resistance to humidity is not sufficient.

In the structure shown in FIG. 16, if a material such as PSG (Phospho Silicate Glass) film or a polyimide film which allows selective etching with $Si_3N_4$ is used as surface protecting film 12, the additional step of photolithography becomes unnecessary. At this time, the metal pattern on the photodiode may be removed simultaneously with the patterning of the second interconnection layer. Therefore, an additional step is not necessary at all with respect to the structure of FIG. 14.

However, in such approach, PSG film or polyimide film does not have sufficient humidity resistance, and hence photodetector element containing a circuit element having superior resistance to humidity cannot be provided. In other words, a photodetector element containing a circuit element having superior humidity resistance as well as stable optical sensitivity could not be provided by any of the above described techniques.

SUMMARY OF THE INVENTION

Therefore, a first object of the present invention is to solve the above-described problems and to provide a photodetector element containing a circuit element in which metal interconnections formed on a semiconductor substrate are less susceptible to corrosion.

A second object of the present invention is to manufacture a photodetector element containing a circuit element having a light intercepting structure for a signal processing circuit, or a photodetector element containing a circuit element having a two-layered interconnection structure through smaller number of process steps.

A third object of the present invention is to provide a photodetector element containing a circuit element in which a light emitting element can be directly die-bonded on a semiconductor substrate.

A fourth object of the present invention is to manufacture, in a photodetector element containing a circuit element having a anti-reflection film on the photodetector element, a structure having superior humidity resistance through smaller number of process steps.

The above described objects of the present invention is attained by the photodetector element containing a circuit element in accordance with the present invention which includes a semiconductor substrate having, on the substrate, a metal interconnection portion and a bonding pad portion, a surface protecting insulating film formed on the semiconductor substrate and covering the metal interconnection portion, and an anti-corrosion metal portion covering the bonding pad portion.

According to another aspect, the photodetector element containing a circuit element further includes a light emitting element provided on the anti-corrosion metal portion formed on the semiconductor substrate.

According to another aspect of the present invention, the semiconductor substrate of the photodetector element containing a circuit element includes a signal processing circuit, and a photodetector element includes an insulating film formed on the signal processing circuit on the semiconductor substrate, and an anti-corrosion metal portion formed on the insulating film.

According to still another aspect, a method of manufacturing a photodetector element containing a circuit element includes the steps of forming a anti-reflection film having a prescribed refractive index on the semiconductor substrate, forming a metal layer on the anti-reflection film, forming an anti-corrosion metal layer on the metal layer, and removing the metal layer and the anti-corrosion metal layer.

According to the present invention, first, humidity resistance of the photodetector element containing a circuit element can be improved. Second, the light emitting element can be formed on the semiconductor substrate, and hence the size of the element can be reduced. Third, the anti-corrosion metal portion can be formed on the signal processing circuit, so that malfunction of the circuit can be suppressed and the necessary number of steps for manufacturing the element can be reduced. Fourth, highly humidity resistant structure for the photodetector element containing a circuit element having a anti-reflection film on the photodetector element can be manufactured through smaller number of process steps.

The foregoing and other objects, features, aspects and advantages of the present invention will become more

DESCRIPTION OF THE PREFERRED EMBODIMENTS

Figure 1:
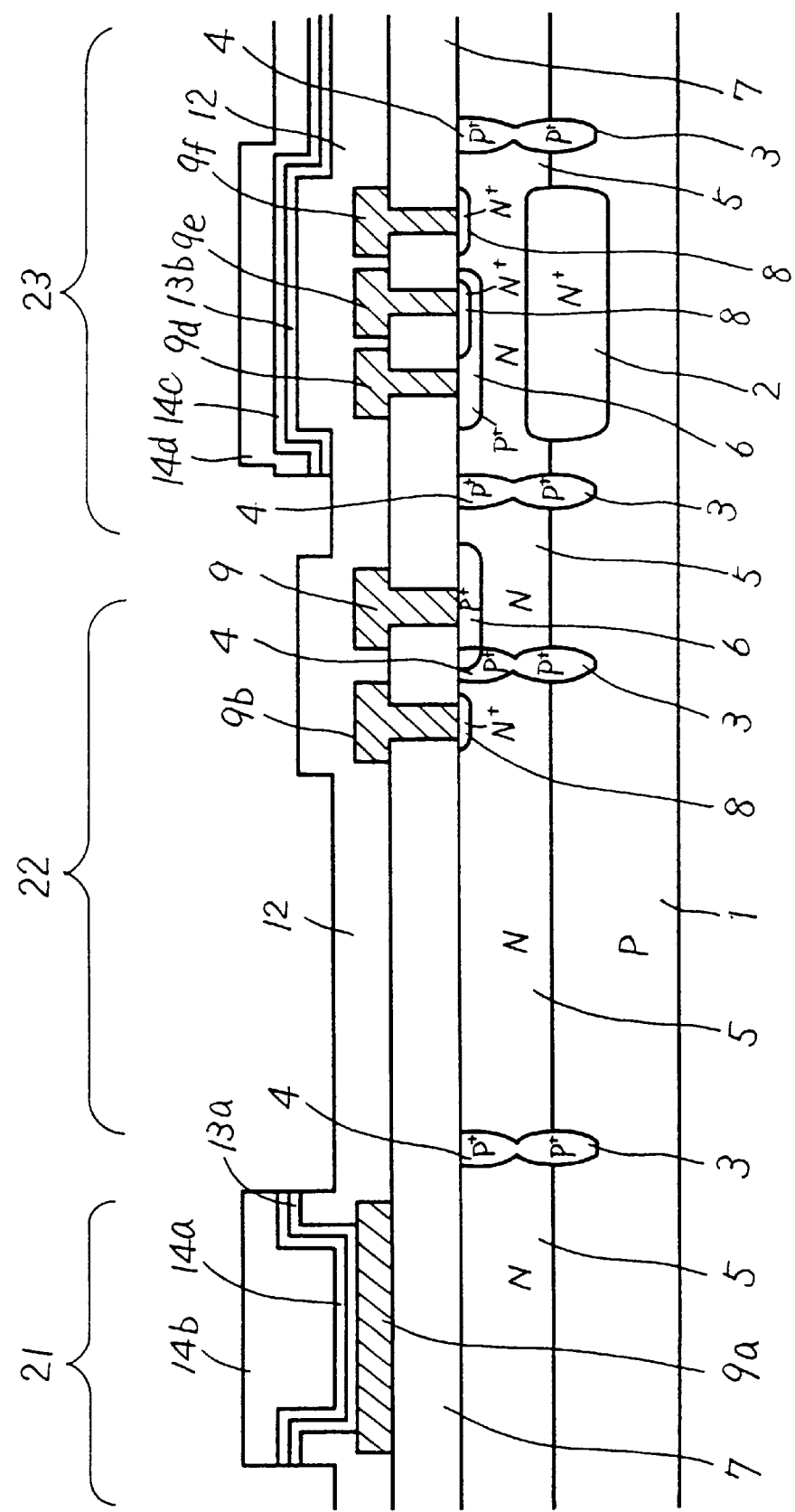
FIG. 1 is a schematic cross section of a photodetector element containing a circuit element in accordance with a first embodiment of the present invention.

Preferred embodiments of the present invention will be described with reference to the figures. In the figures, same reference characters denote the same or like portions.

Referring to FIG. 1, the photodetector element containing a circuit element includes a P type substrate 1, an N type epitaxial layer 5, an $SiO_2$ film 7, a metal layer 9, a surface protecting insulating film 12, a titanium-tungsten alloy layer 13 and a gold layer 14 stacked in this order from the bottom.

That n type buried diffusion layer 2, P type buried isolation diffusion layer 3, P type isolation diffusion layer 4, a P type diffusion layer 6 and N type diffusion layer 8 are formed in P type substrate 1 and N type epitaxial layer 5 is similar to the related art examples. Therefore, description thereof is not repeated. There is an opening at a prescribed position of $SiO_2$ film 7, and a part of metal layer 9 extending in the opening provides electric connection through $SiO_2$ film 7.

As in the related art, the photodetector element containing a circuit element is, in general, divided into bonding pad portion 21, photodiode portion 22 and signal processing circuit portion 23.

Here, surface protecting insulating film 12 is formed of $Si_3N_4$. On metal layer 9a in bonding pad portion 21, a titanium-tungsten alloy layer 13a is formed. On titanium-tungsten alloy layer 13a, a gold layer 14a is formed. On gold layer 14a, a gold layer 14b which is thicker than gold layer 14a is formed.

The titanium-tungsten alloy layer 13a in bonding pad portion 21 is formed to improve adhesiveness between gold and metal layer 9a of aluminum. Similarly, on surface protecting insulating film 12 in signal processing circuit portion 23, titanium-tungsten alloy layer 13b and gold layers 14c and 14d are formed.

In this manner, in the photodetector element containing a circuit element in accordance with the first embodiment of the present invention, the substrate surface is covered with a surface protecting insulating film 12 $Si_3N_4$, and metal layer 9a in bonding pad portion 21 is covered by gold layers 14a and 14b with titanium-tungsten alloy layer 13a interposed. Therefore, corrosion of aluminum, which is susceptible to corrosion, can be prevented.

Further, since entrance of light to signal processing circuit portion 23 is intercepted by titanium-tungsten alloy layer 13b and gold layers 14c and 14d, malfunction of the circuit caused by parasitic current can be prevented.

Further, since the material covering the bonding pad portion is the same as the material intercepting light to the signal processing circuit portion 23, these portions can be formed simultaneously by photolithography, for example, and hence the number of process steps can be reduced.

The metal covering bonding pad portion 21 has only to be a metal having high resistance to corrosion. Therefore, instead of gold, platinum may be used. In view of humidity resistance, $Si_3N_4$ is desirable for the protecting film 12. However, a surface protecting insulating film of $SiO_2$ may be used. In this case, corrosion of metal layer 9a covered by surface protecting insulating film 12 cannot be avoided. However, even in this case, the portion covering bonding pad portion 21 of gold, for example, and the portion intercepting light to the signal processing circuit portion 23 can be formed simultaneously, so that the number of manufacturing steps can be made smaller than in the related art. Further, resistance to humidity at bonding pad portion 21 can be improved.

The steps of manufacturing the photodetector element containing a circuit element shown in FIG. 1 will be described in the following.

FIGS. 2 to 5 show steps of manufacturing the photodetector element containing a circuit element shown in FIG. 1.

Figure 2:
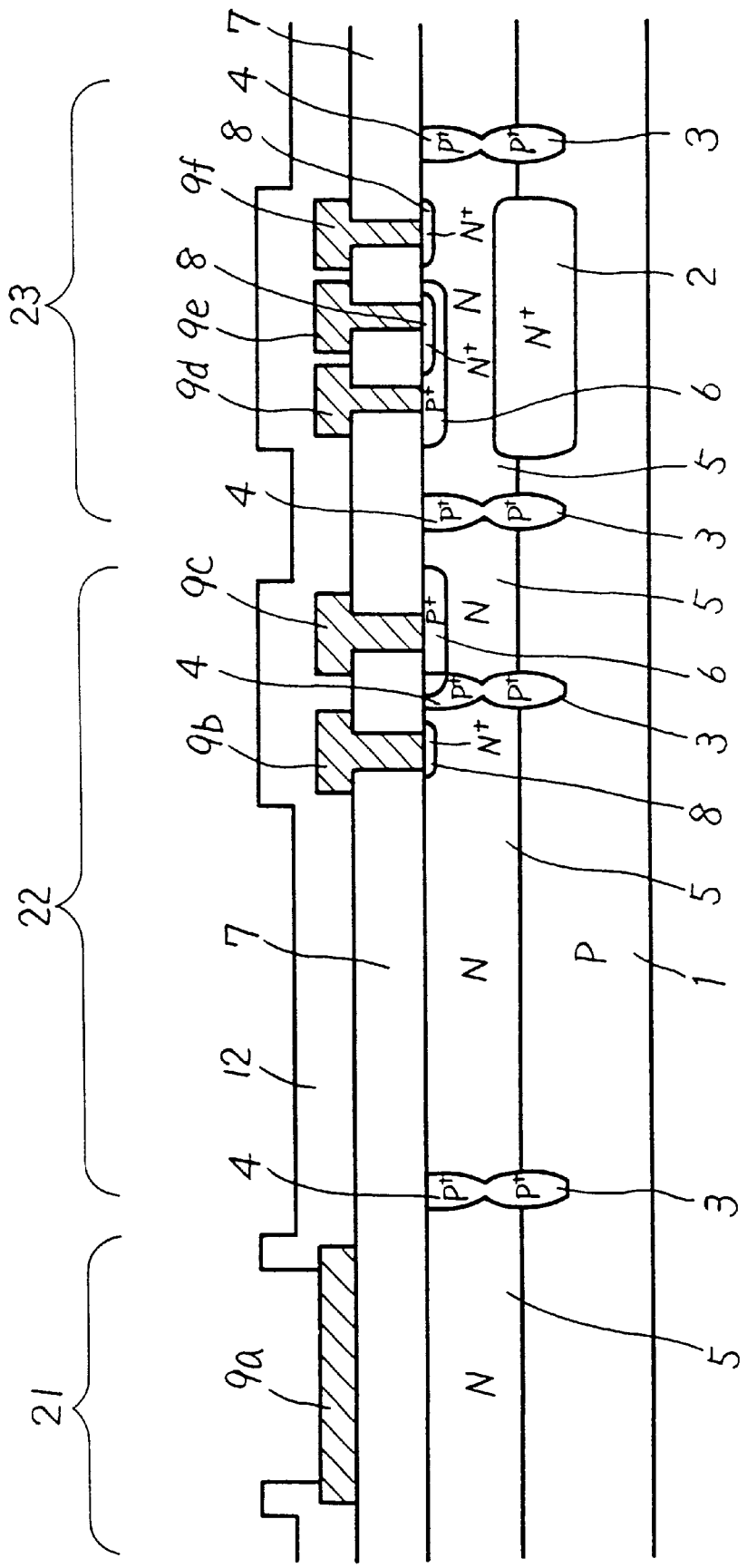
FIGS. 2 to 5 show steps of manufacturing a photodetector element containing a circuit element shown in FIG. 1.
Figure 3:
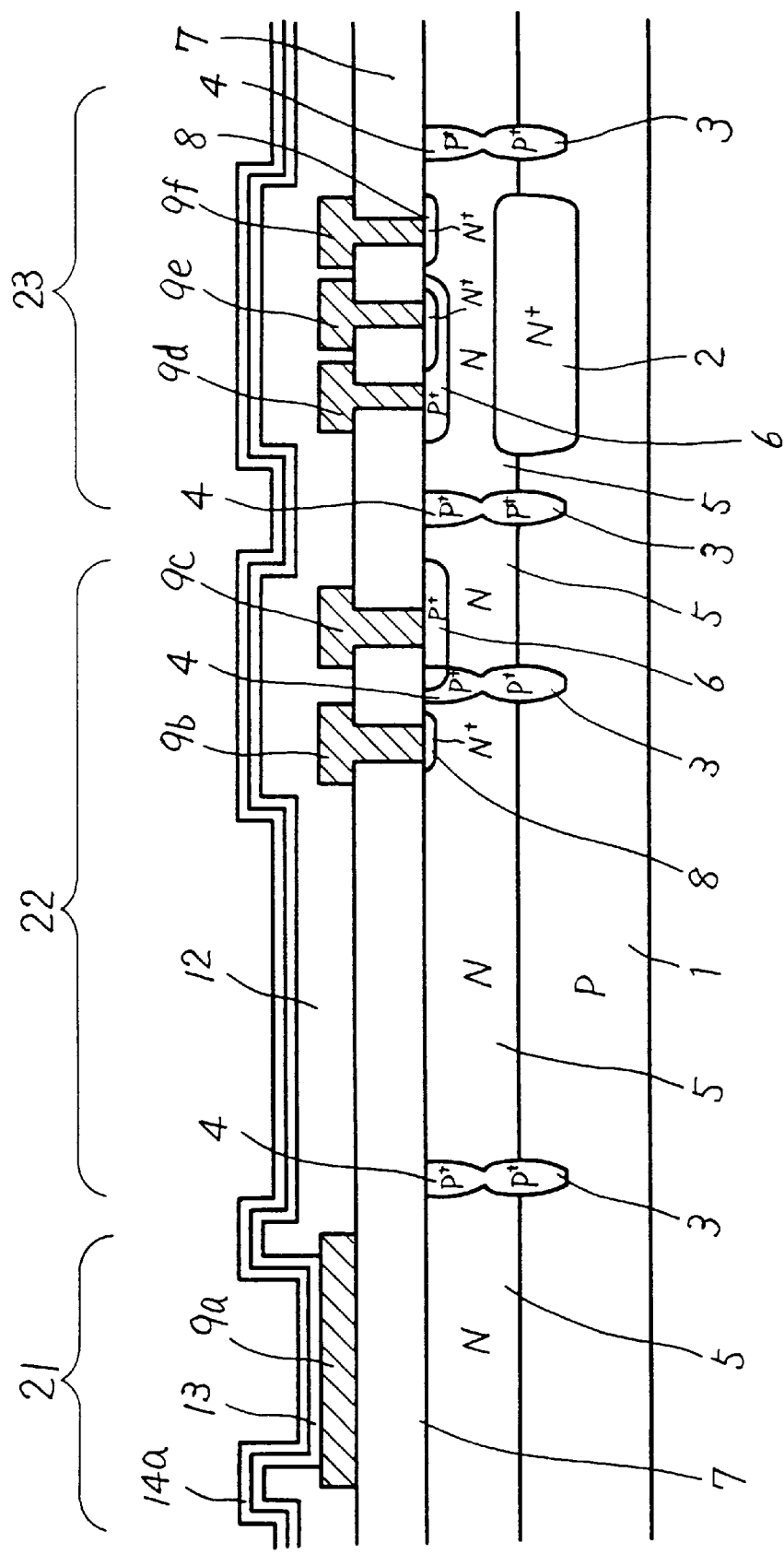
Figure 4:
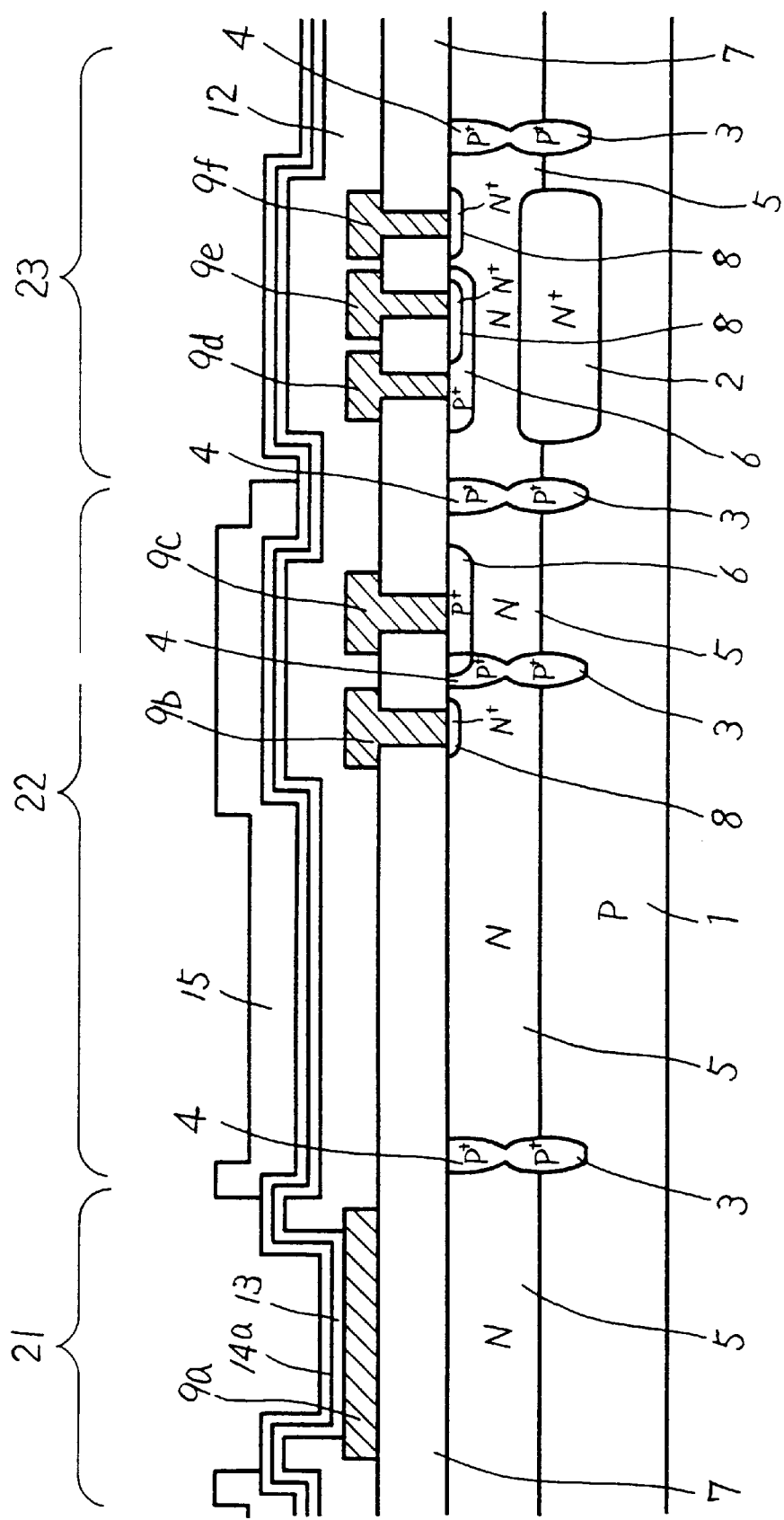
Figure 5:
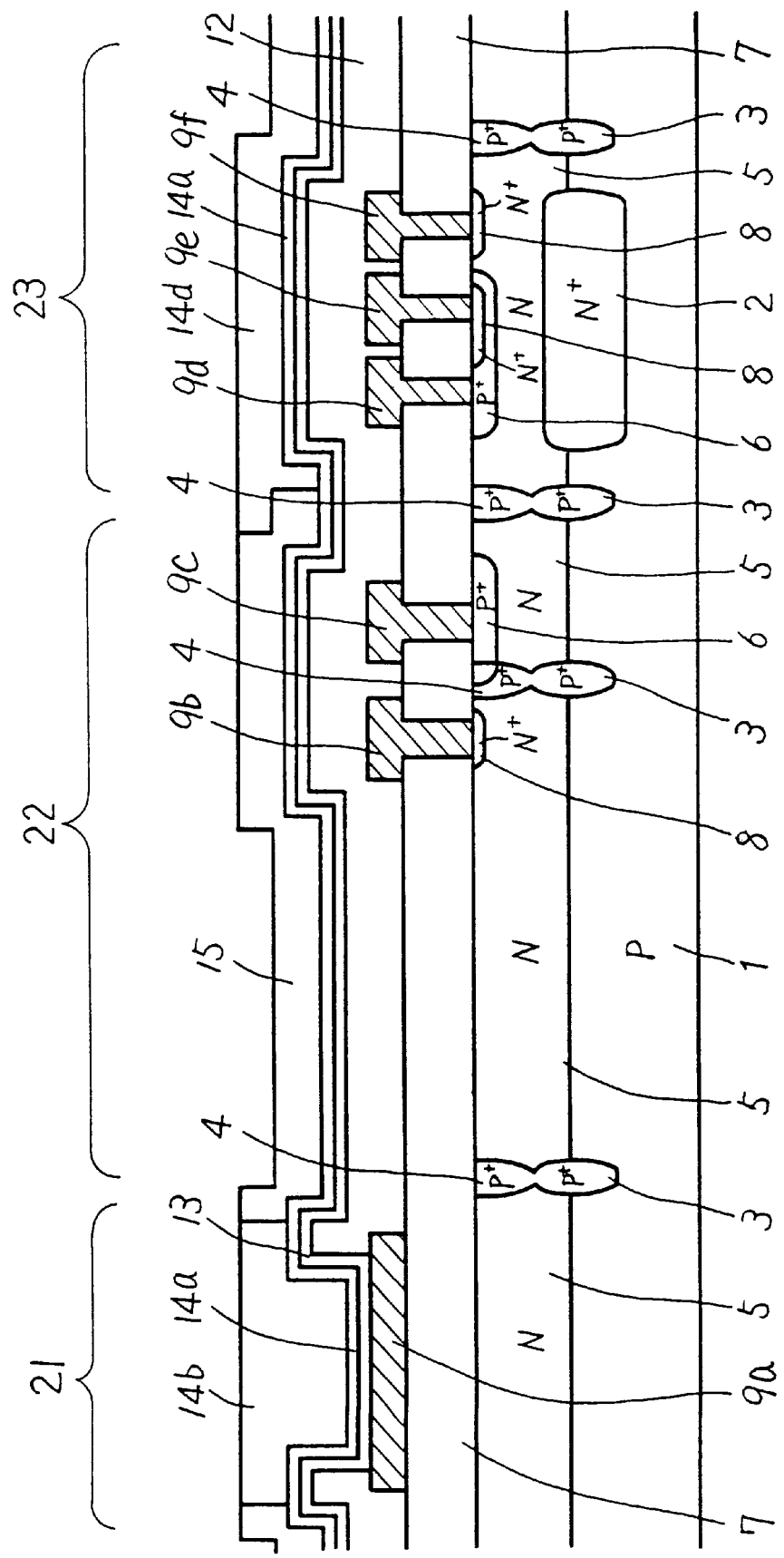

First, referring to FIG. 2, various impurities are diffused in a semiconductor substrate having P type substrate 1 and N type epitaxial layer 5, and thereafter, a first metal interconnection (metal layer) 9 of aluminum is formed. Thereafter, surface protecting insulating film 12 of $Si_3N_4$ is formed. Thereafter, bonding pad portion 21 of surface protecting insulating film 12 is opened. Thereafter, referring to FIG. 3, titanium-tungsten alloy layer 13 and a gold thin film layer 14a are formed successively by sputtering. Photoresist 15 is applied, and thereafter, patterned to open the portion forming the light intercepting film on signal processing circuit 23 and the metal at the bonding pad portion 21, as shown in FIG. 4. Thereafter, by electrolytic plating or the like, thick film layers 14b and 14d of gold are formed at portions of the semiconductor substrate to which photoresist has not been applied. Finally, photoresist 15 is removed by a dedicated releasing liquid, and titanium-tungsten alloy layer 13 and gold thin film layer 14a are etched by using the thick gold layer 14b as a mask, resulting in the photodetector element containing a circuit element shown in FIG. 1.

Figure 14:
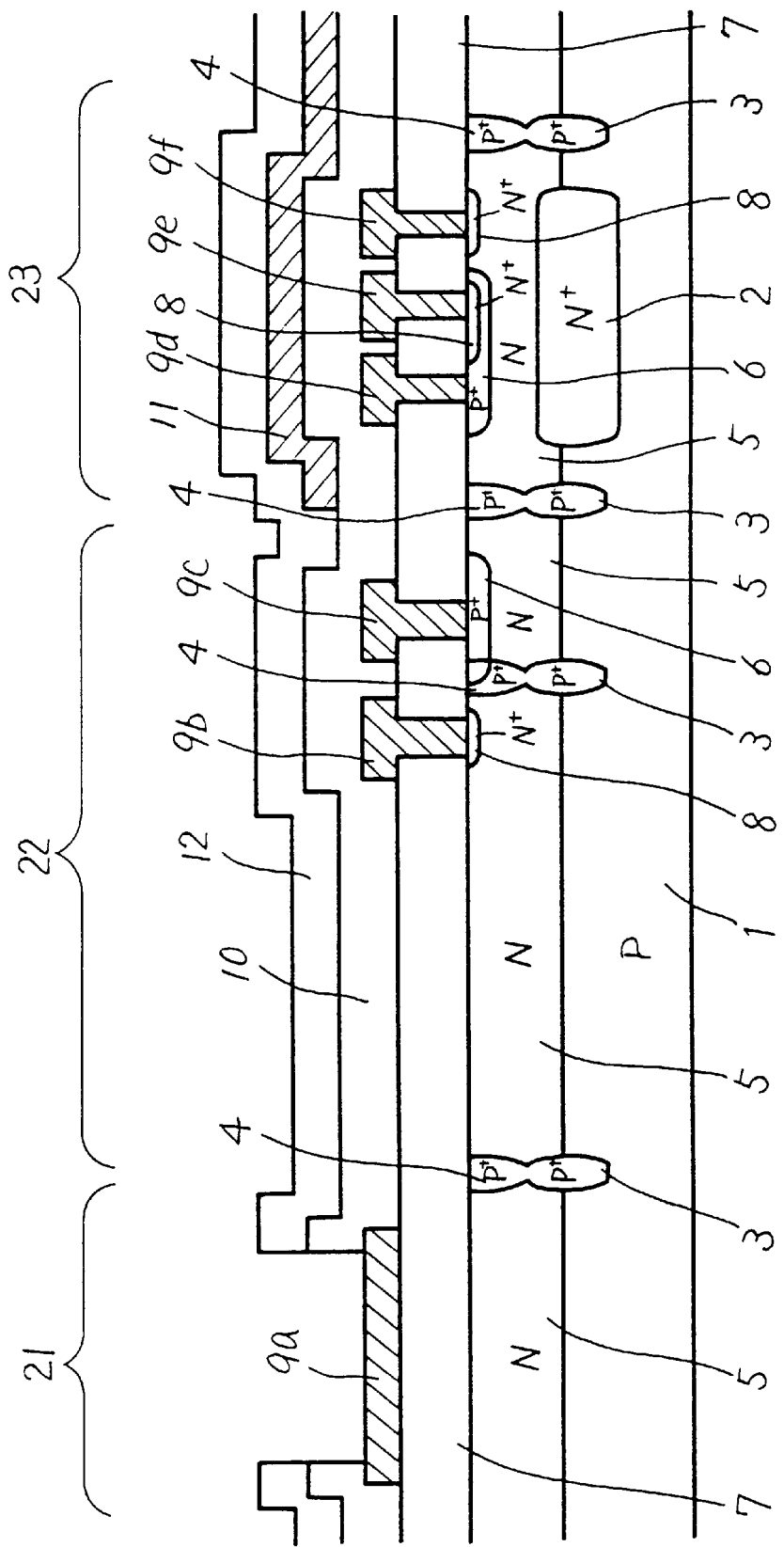

More specifically, in the related art example shown in FIG. 14, two steps of photolithography were necessary to provide a structure intercepting light to the signal processing circuit portion 23, whereas a structure having similar function can be implemented by only one step of photolithography in accordance with the present invention. In the photodetector element containing a circuit element shown in FIG. 1, if improvement in humidity resistance only is desired, the light intercepting film including titanium-tungsten alloy layer 13b and gold layers 14c and 14d covering signal processing circuit portion 23 is not always necessary.

Figure 6:
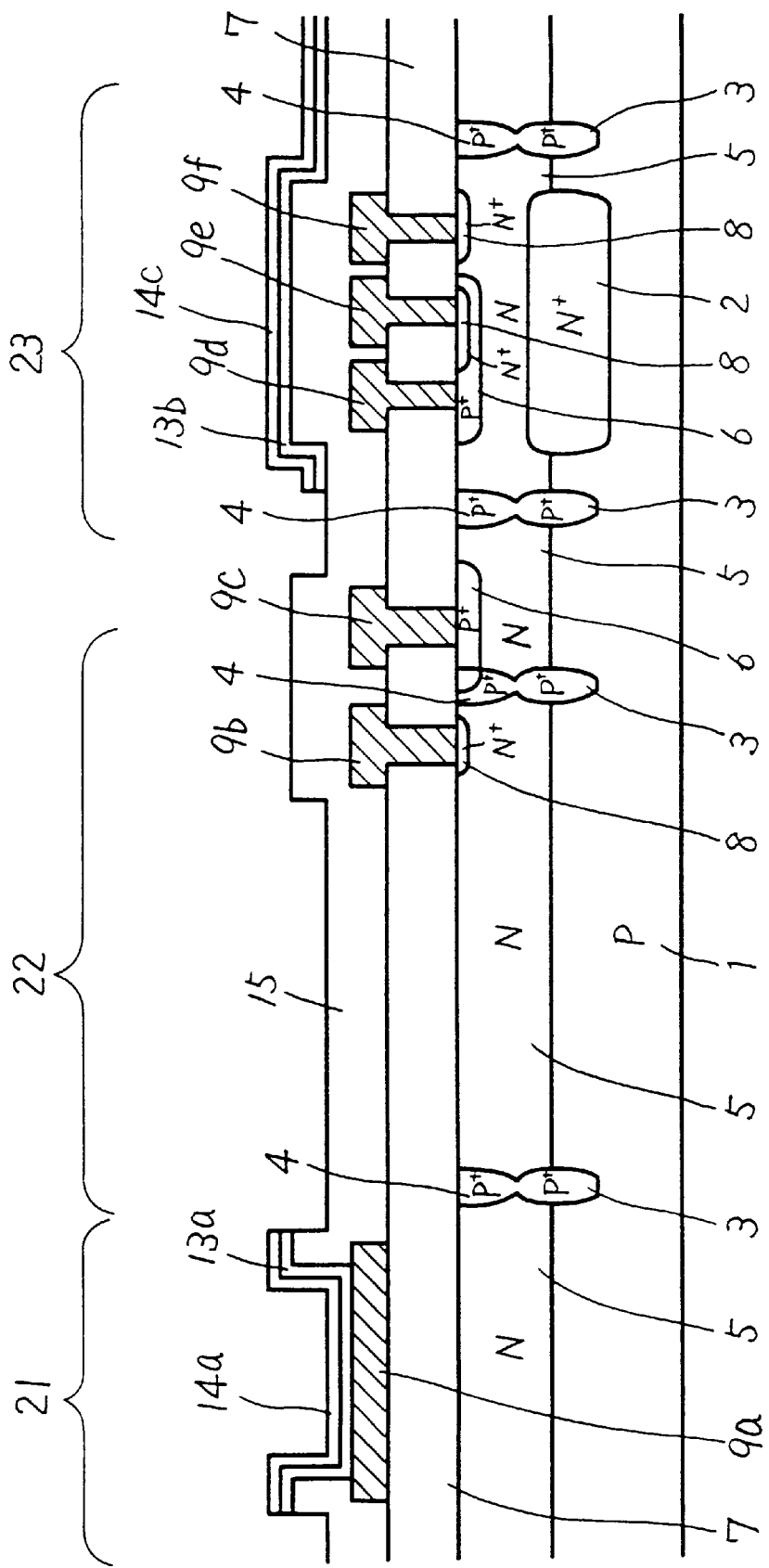
FIG. 6 shows a modification of the first embodiment of the present invention.

Further, in view of the improvement of humidity resistance at the bonding pad portion, gold layer 14b provided in bonding pad portion 21 is not always necessary. When a photodetector element containing a circuit element not having gold layer 14b is to be formed, the semiconductor substrate after the manufacturing steps shown in FIGS. 2 and 3 may be subjected to photolithography to remove titanium-tungsten alloy layer 13 and gold layer 14 at portions other than bonding pad portion 21 and signal processing circuit portion 23. Thus a photodetector element containing a circuit element not having the thick gold layer shown in FIG. 6 is formed.

Figure 7:
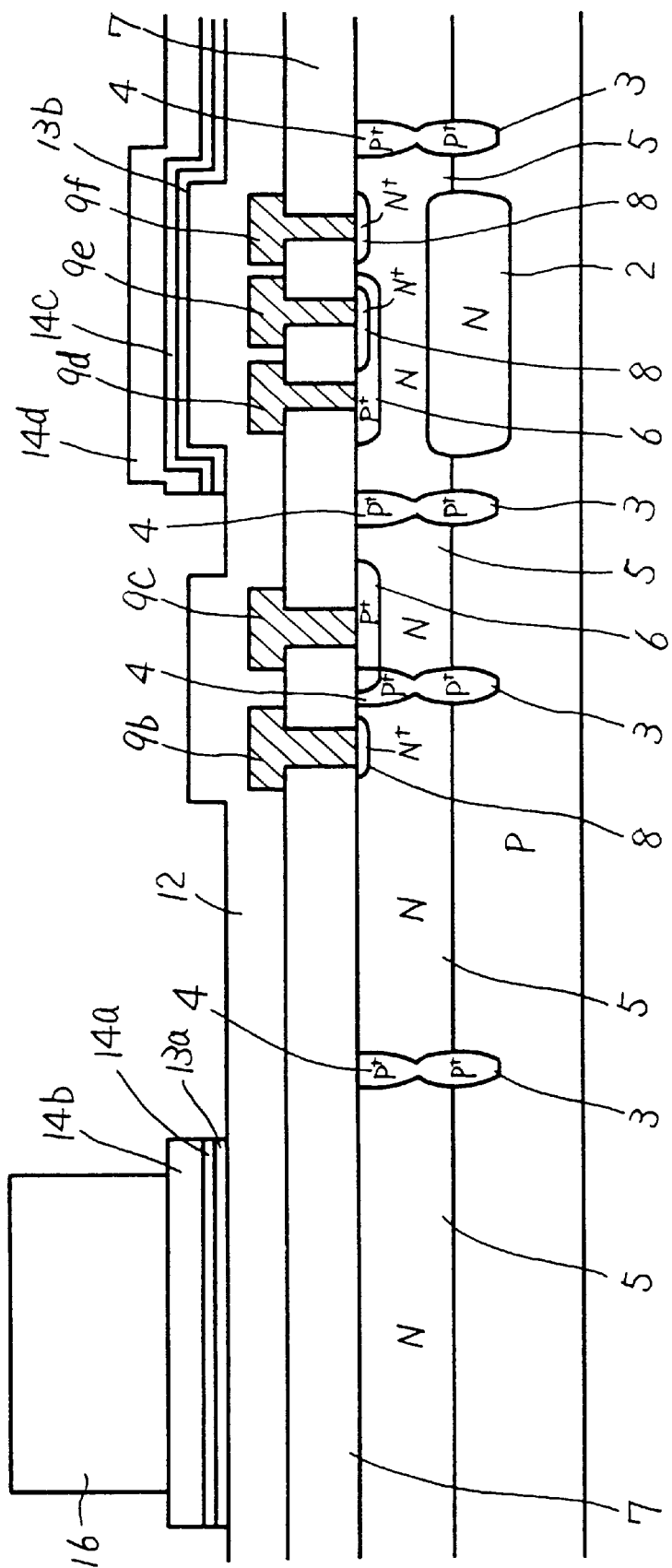
FIG. 7 shows a laser chip die-bonded on the substrate of the photodetector element containing a circuit element in accordance with the first embodiment of the present invention.

Further, according to the embodiment of the present invention, it becomes possible to directly die-bond a light emitting element such as a semiconductor laser, on a base formed on the semiconductor substrate, which is the gold layers 14a and 14b. For example, in the structure of the photodetector element containing a circuit element shown in FIG. 7, a semiconductor laser chip 16 is directly die-bonded on titanium-tungsten alloy layer 13a, gold layer 14a and 14b formed on surface protecting insulting film 12. Bonding pad portion is not shown in FIG. 7. Direct die-bonding of semiconductor laser chip on the semiconductor substrate allows reduction in size of the component such as an optical pickup.

Figure 8:
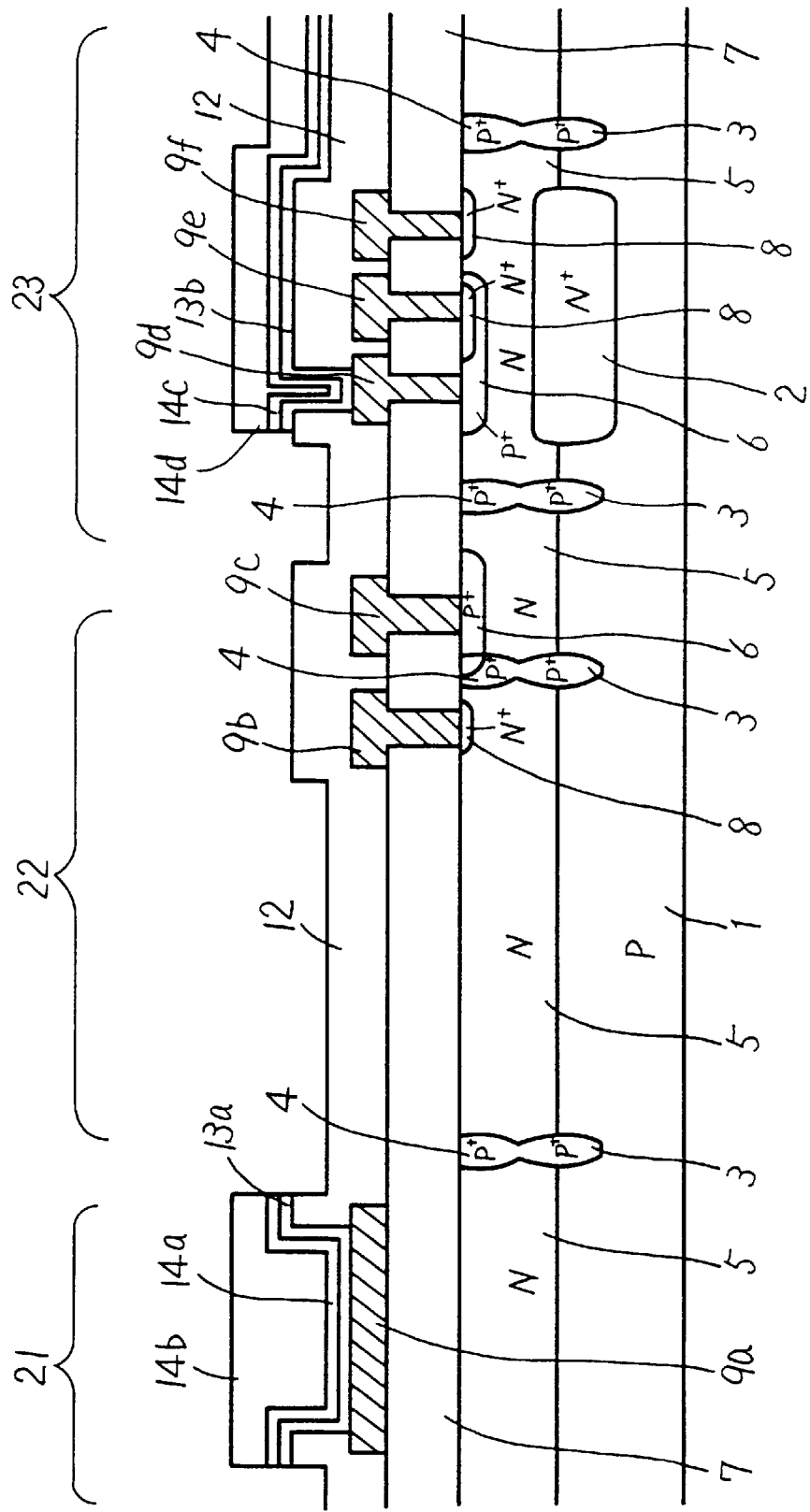
FIG. 8 is a cross section showing a structure of a photodetector element containing a circuit element in accordance with the second embodiment.

FIG. 8 is a schematic cross section showing a structure of the photodetector element containing a circuit element in accordance with a second embodiment of the present invention.

Referring to the figure, the photodetector element containing a circuit element shown in FIG. 8 employs a metal layer consisting of gold layers 14c and 14d and titanium-tungsten alloy layer 13b of the photodetector element containing a circuit element in accordance with the first embodiment shown in FIG. 1 as interconnection for signal processing circuit portion 23.

Figure 15:
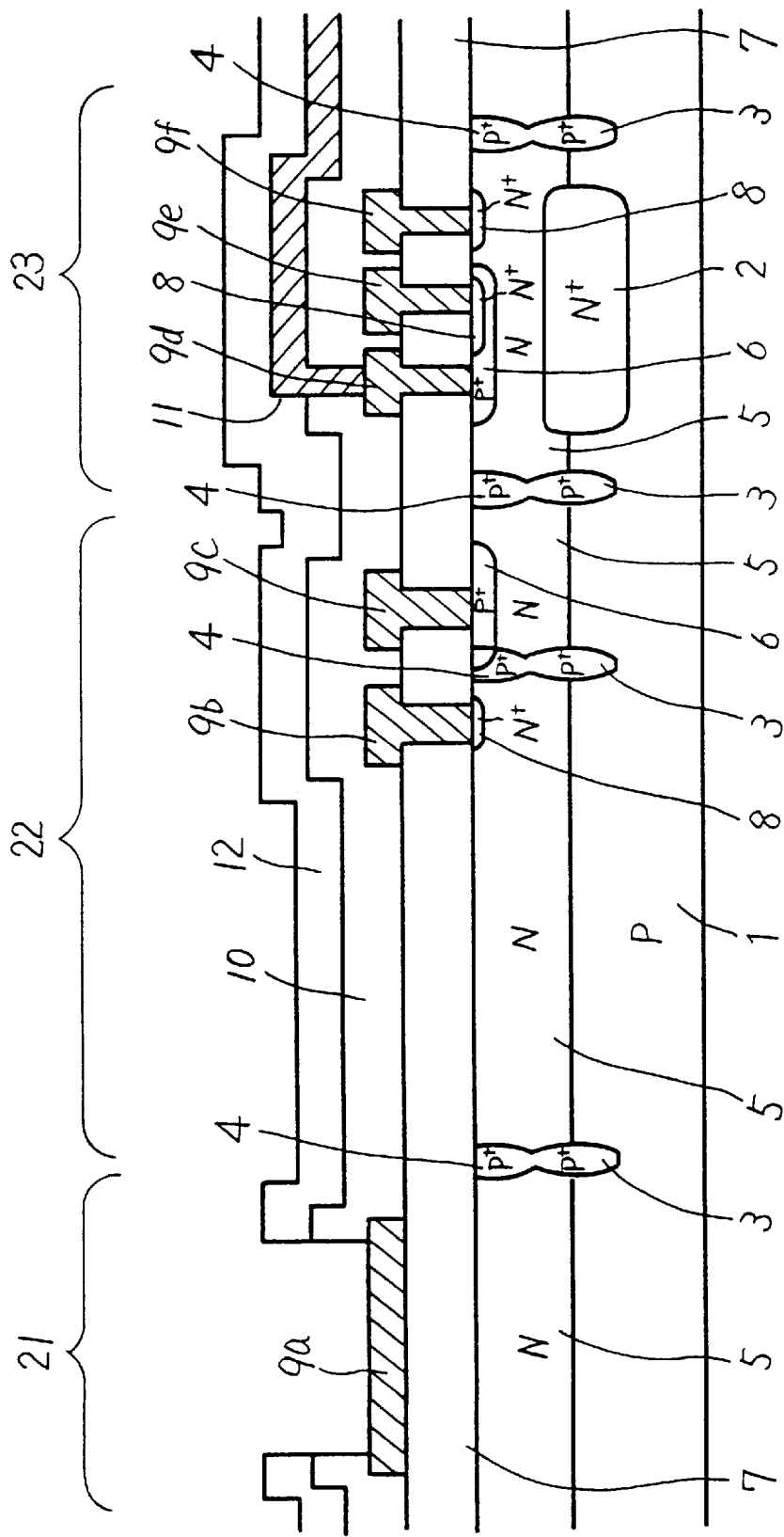

More specifically, in the related art example shown in FIG. 15, the second metal interconnection layer 11, which is formed of aluminum, has poor resistance to corrosion. By contrast, according to the second embodiment shown in FIG. 8, the second interconnection layer is formed by an anti-corrosion metal such as gold, and hence corrosion resistance is remarkably improved. Further, similar to the first embodiment shown in FIG. 1, corrosion resistance can be improved without a protecting film. Therefore, the element can be manufactured through smaller number of steps and at reduced cost as compared with the related art examples.

Figure 9:
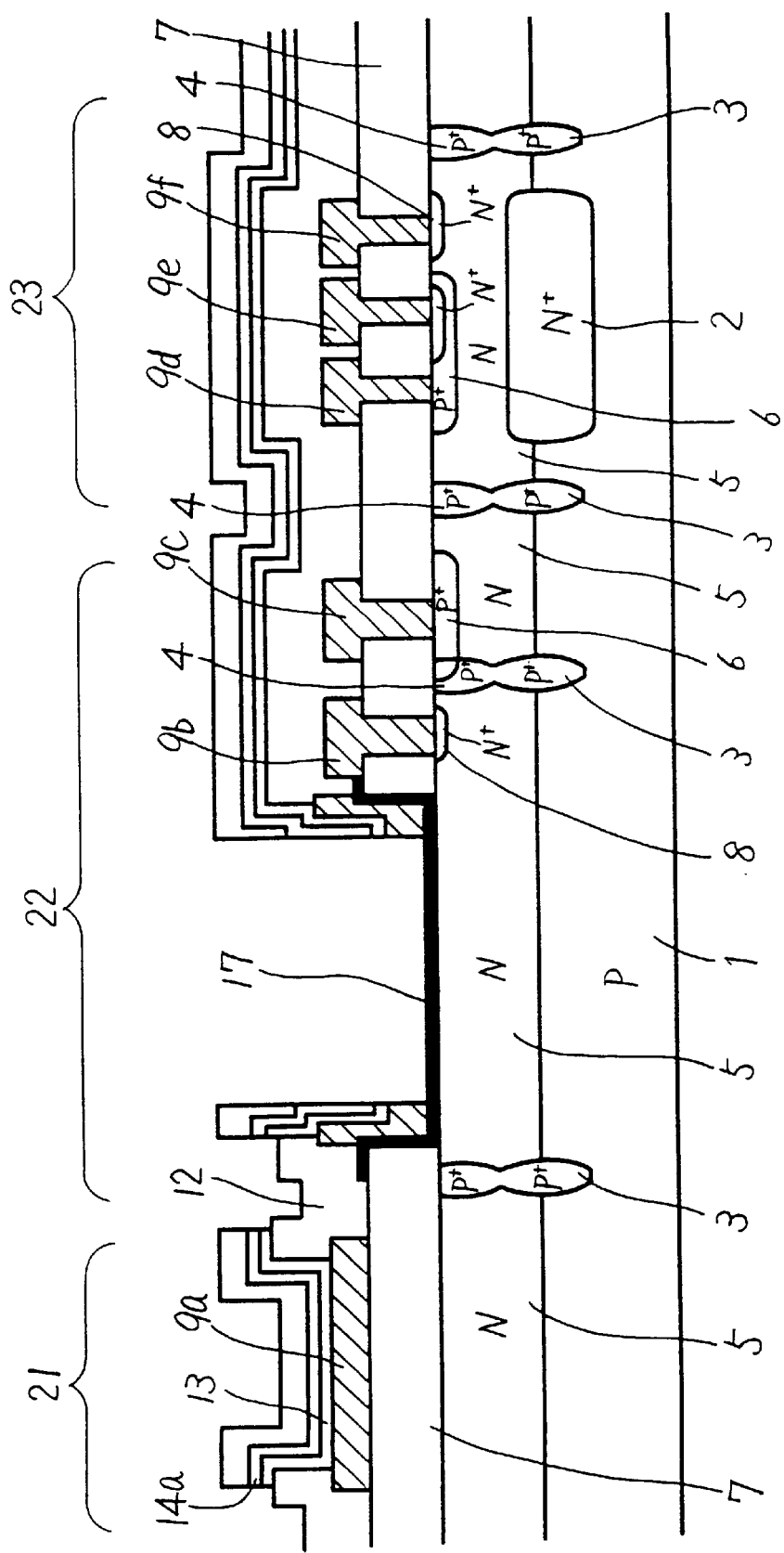
FIG. 9 is a cross section showing a structure of a photodetector element containing a circuit element in accordance with a third embodiment of the present invention.

FIG. 9 is a schematic cross section showing a structure of a photodetector element containing a circuit element in accordance with a third embodiment of the present invention. In this embodiment, an $SiO_2$ film 7 of photodiode portion 22, which is the photodetector element, is opened, and a anti-reflection film 17 of $Si_3N_4$ having a prescribed refractive index is formed. This realizes improved optical sensitivity. Further, surface protecting film 12 at signal processing circuit portion 23 is formed of $Si_3N_4$, and bonding pad portion 21 is covered with gold. Therefore, a photodetector element containing a circuit element having superior resistance to humidity can be implemented.

Figure 10:
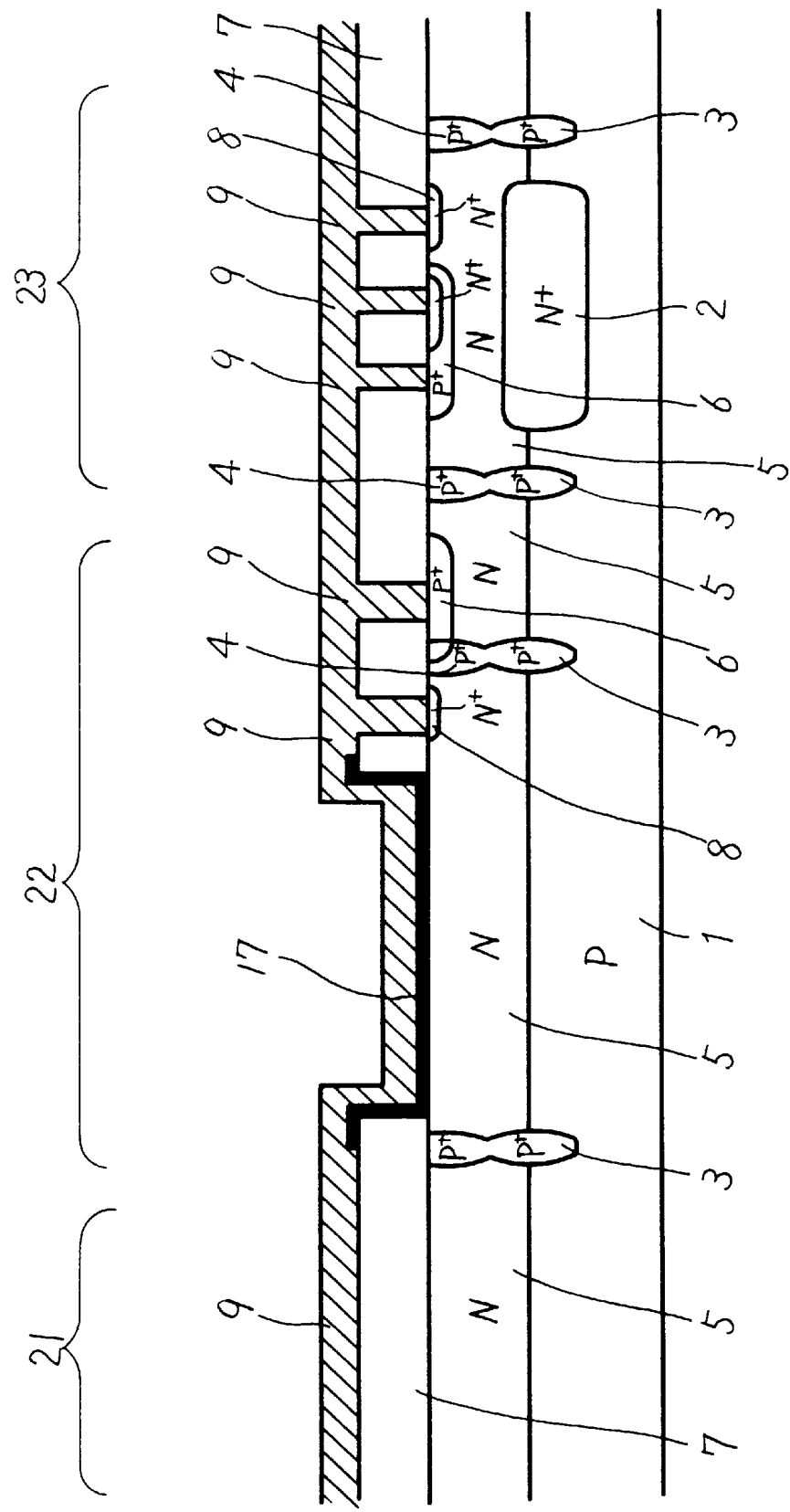
FIGS. 10 to 12 show steps of manufacturing the photodetector element containing a circuit element shown in FIG. 9.
Figure 11:
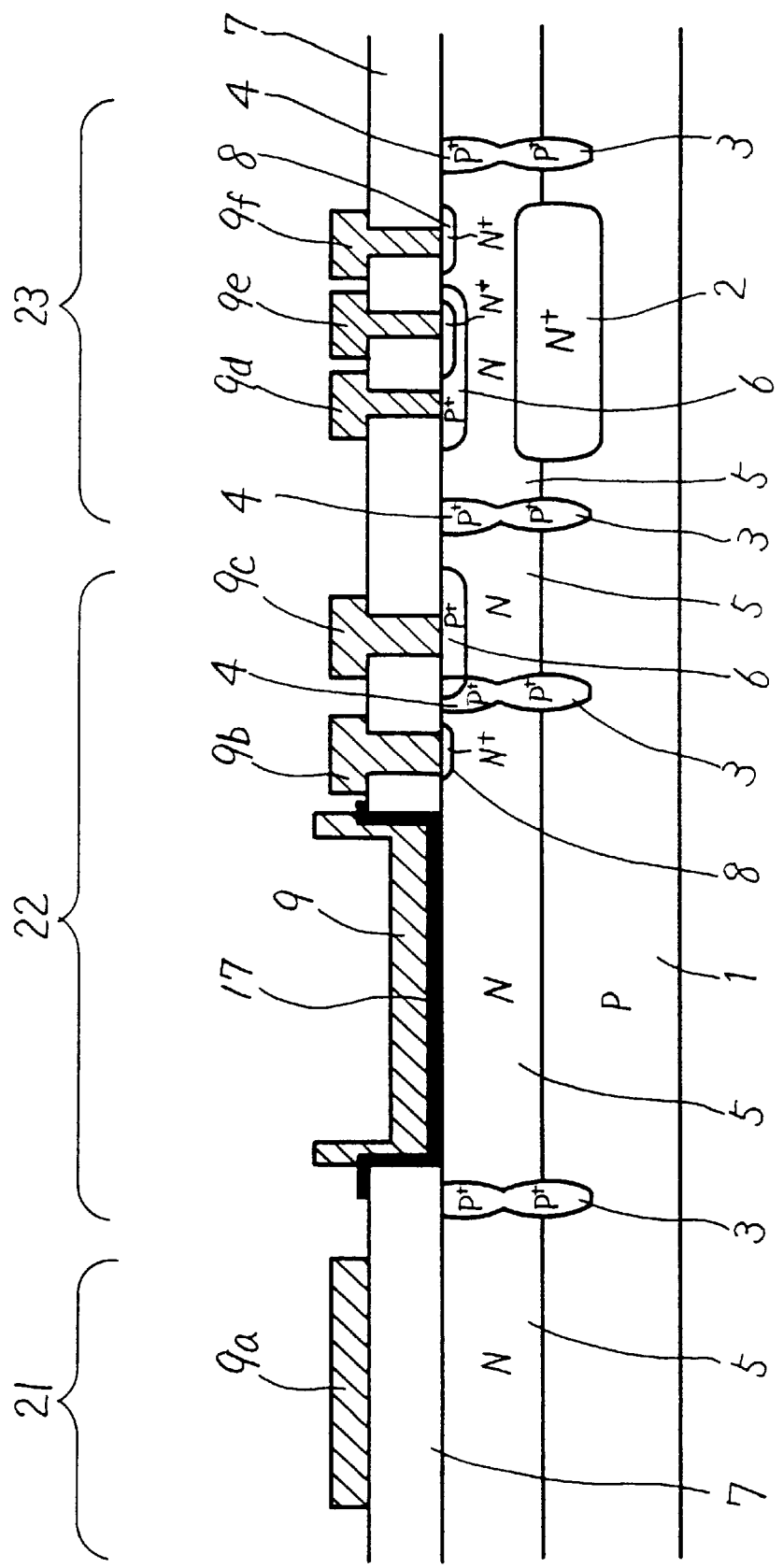
Figure 12:
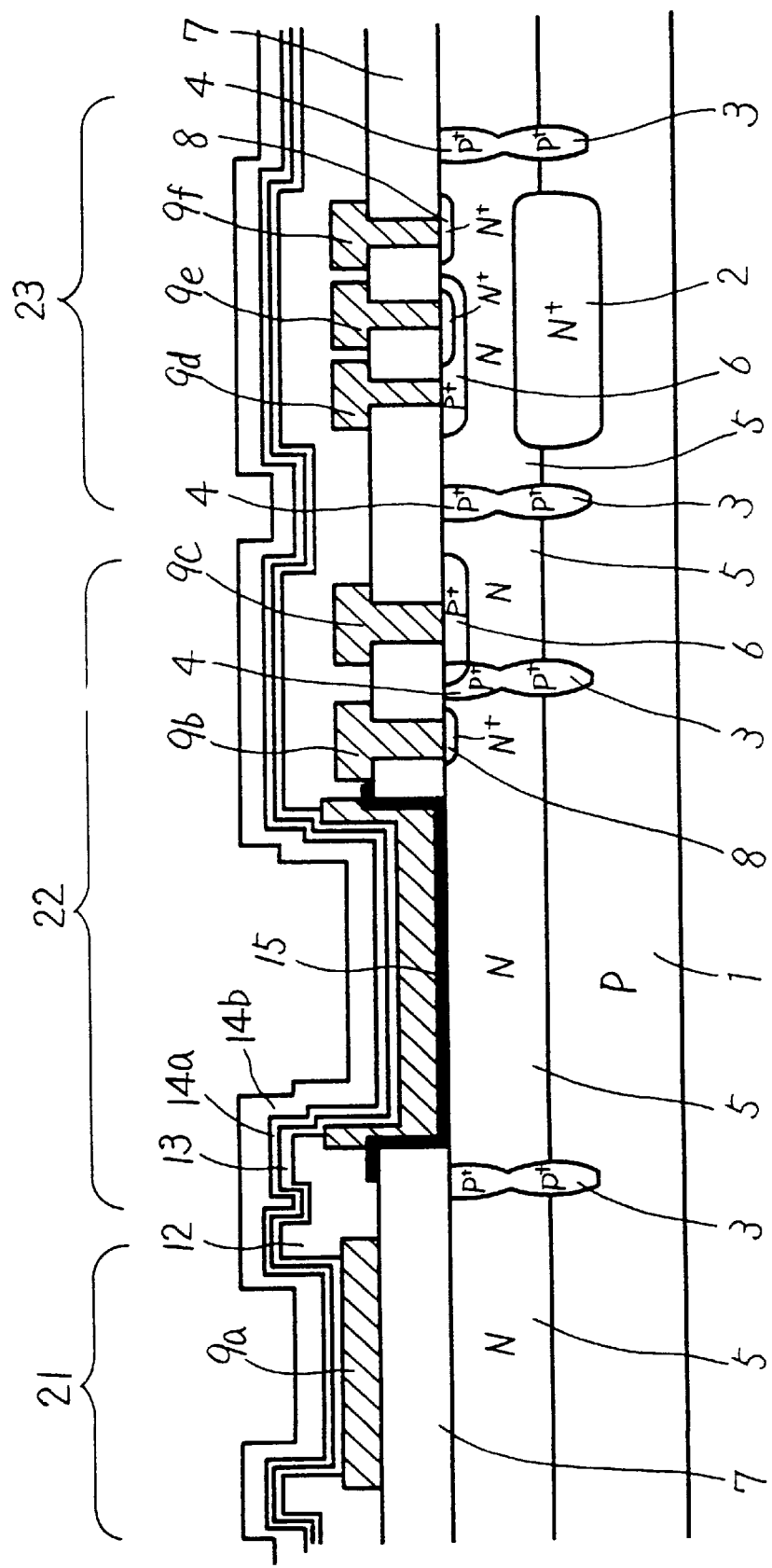
Figure 13:
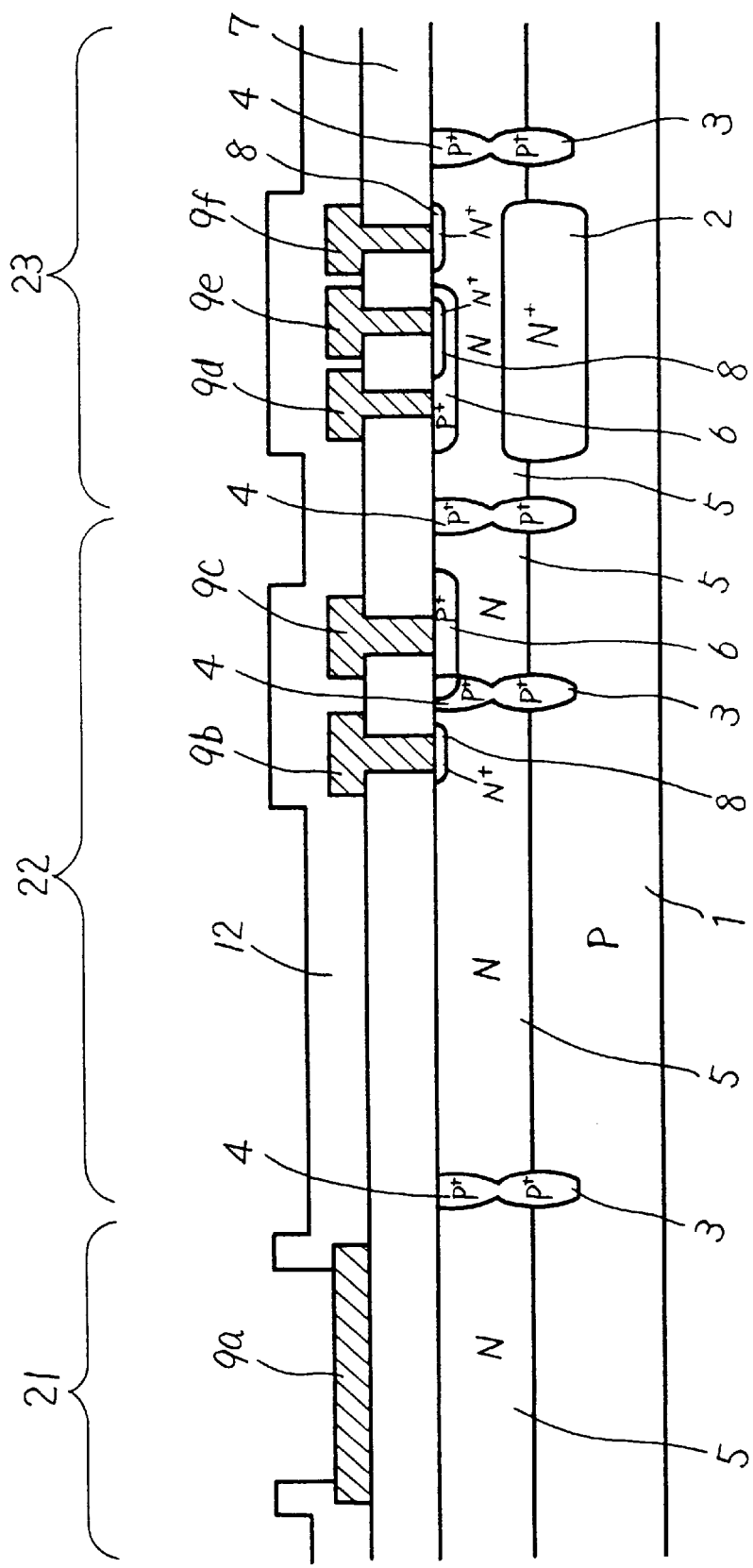
FIGS. 13 to 16 are schematic cross sections of a photodetector element containing a circuit element of related art examples.

The photodetector element containing a circuit element shown in FIG. 9 enables precise film thickness control of anti-reflection film 15 without increasing the necessary number of manufacturing steps, as it is manufactured through the steps shown in FIGS. 10 to 12. The steps will be described with reference to the figures.

The steps for forming N type epitaxial layer 5, N type buried diffusion layer 2, buried isolation diffusion layer 3, P type isolation diffusion layer 4, P type diffusion layer 6 and N type diffusion layer 8 in P type substrate 1 are the same as those described with reference to the related art examples. Therefore, description thereof is not repeated. Thereafter, $SiO_2$ film is opened at the photodiode portion 22 as shown in FIG. 10, anti-reflection film 17 of $Si_3N_4$ is formed by the CVD method, a contact hole is opened in $SiO_2$ film, and metal layer 9 of aluminum is deposited. Thereafter, referring to FIG. 11, metal interconnection patterns are formed by photolithography, and at this time, the pattern of metal interconnection layer 9 is left also on the photodiode.

Thereafter, referring to FIG. 12, surface protecting film 12 of $Si_3N_4$ is formed, and the bonding pad portion and the photodiode portion are opened. Thereafter, titanium-tungsten alloy layer 13 and gold thin film layer 14a are formed by sputtering, and thereafter, gold thick layer 14b is formed by vapor deposition or electrolytic plating.

Thereafter, by common photolithography, gold layers 14a and 14b as well as titanium-tungsten alloy layer 13 are patterned, thus forming the gold coating layer at the bonding pad portion and the second interconnection layer of the signal processing circuit. At this time, titanium-tungsten alloy layer 13 and gold layers 14a and 14b on the photodiode are removed simultaneously. Then, aluminum layers 9 on the photodiode is etched by an etchant having higher etch rate for aluminum layer with respect to $Si_3N_4$. Thus, the structure shown in FIG. 9 results. At the time of etching the aluminum layer, gold layers 14a and 14b as well as titanium-tungsten layer 13 may be used as the mask.

Through the above described steps, a photodetector element containing a circuit element having superior humidity resistance, in which the anti-reflection film is formed on the photodiode, can be implemented. According to the above described process, it is not necessary to newly add the step of photolithography to remove the aluminum layers 9 provided for protection of the anti-reflection film on the photodiode, and therefore a photodetector element containing a circuit element having superior humidity resistance and high optical sensitivity can be implemented without any increase in manufacturing cost.

Figure 16:
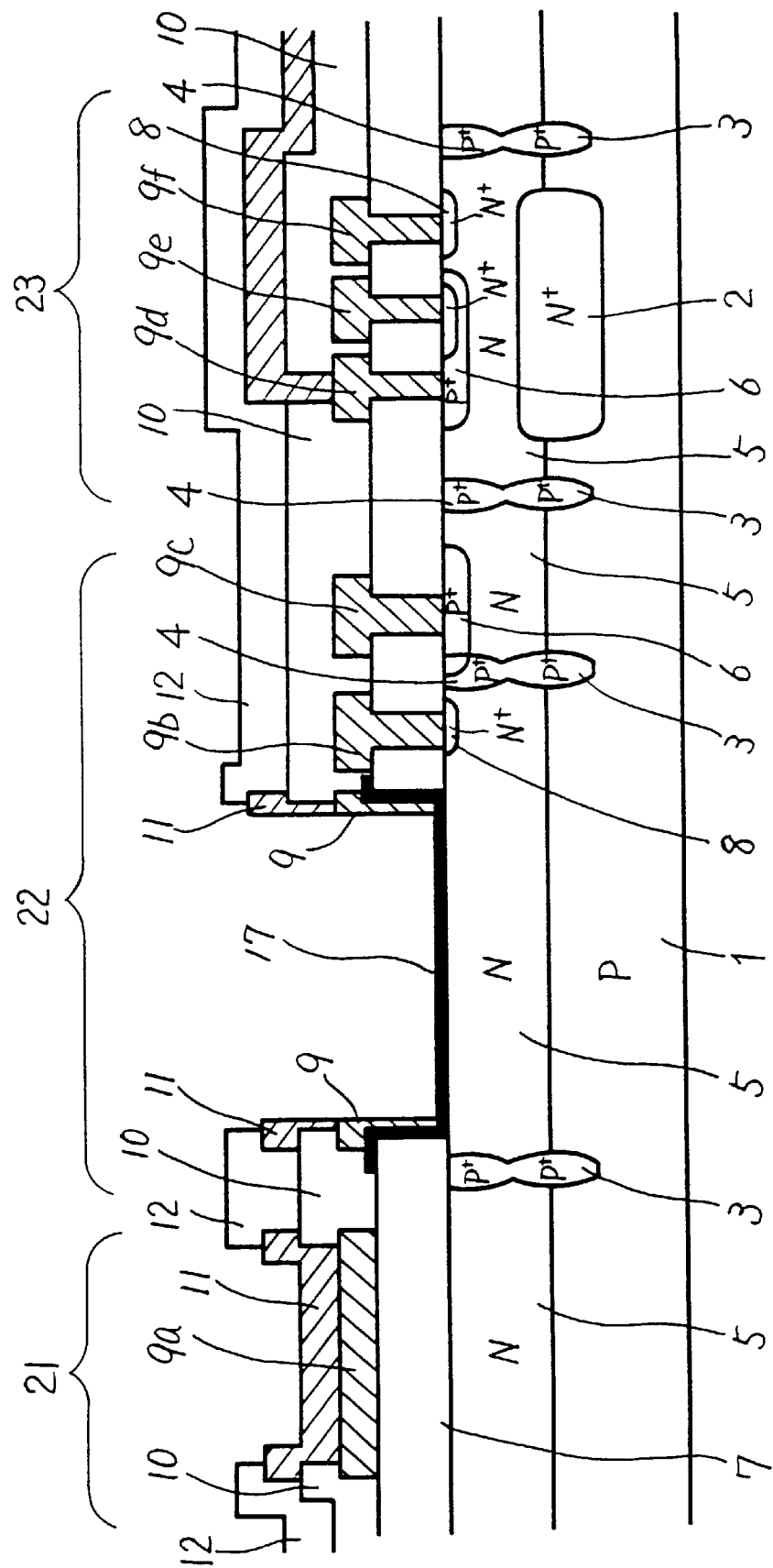
Figure 17:
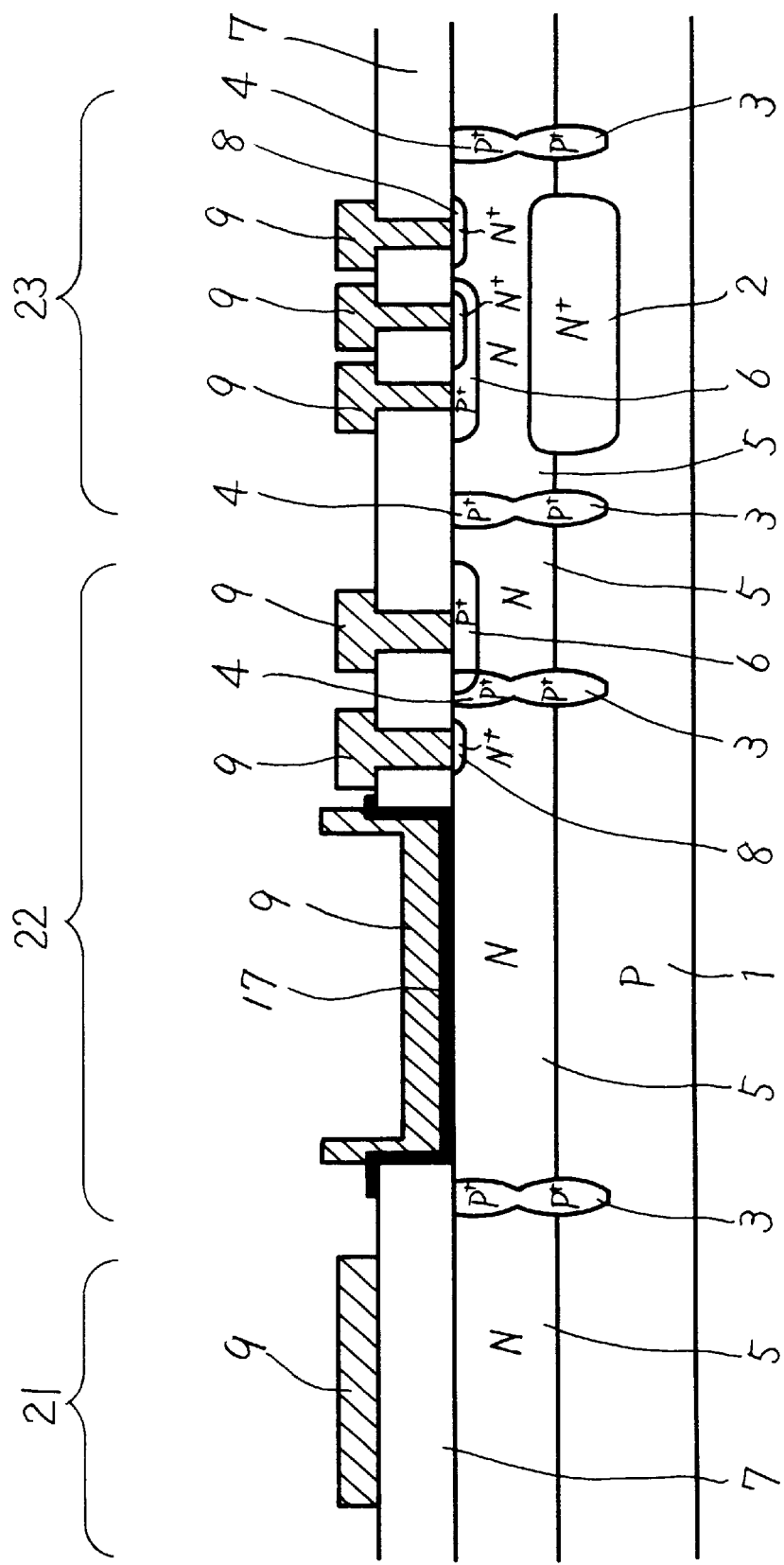
FIGS. 17 and 18 show steps of manufacturing the photodetector element containing a circuit element shown in FIG. 16.
Figure 18:
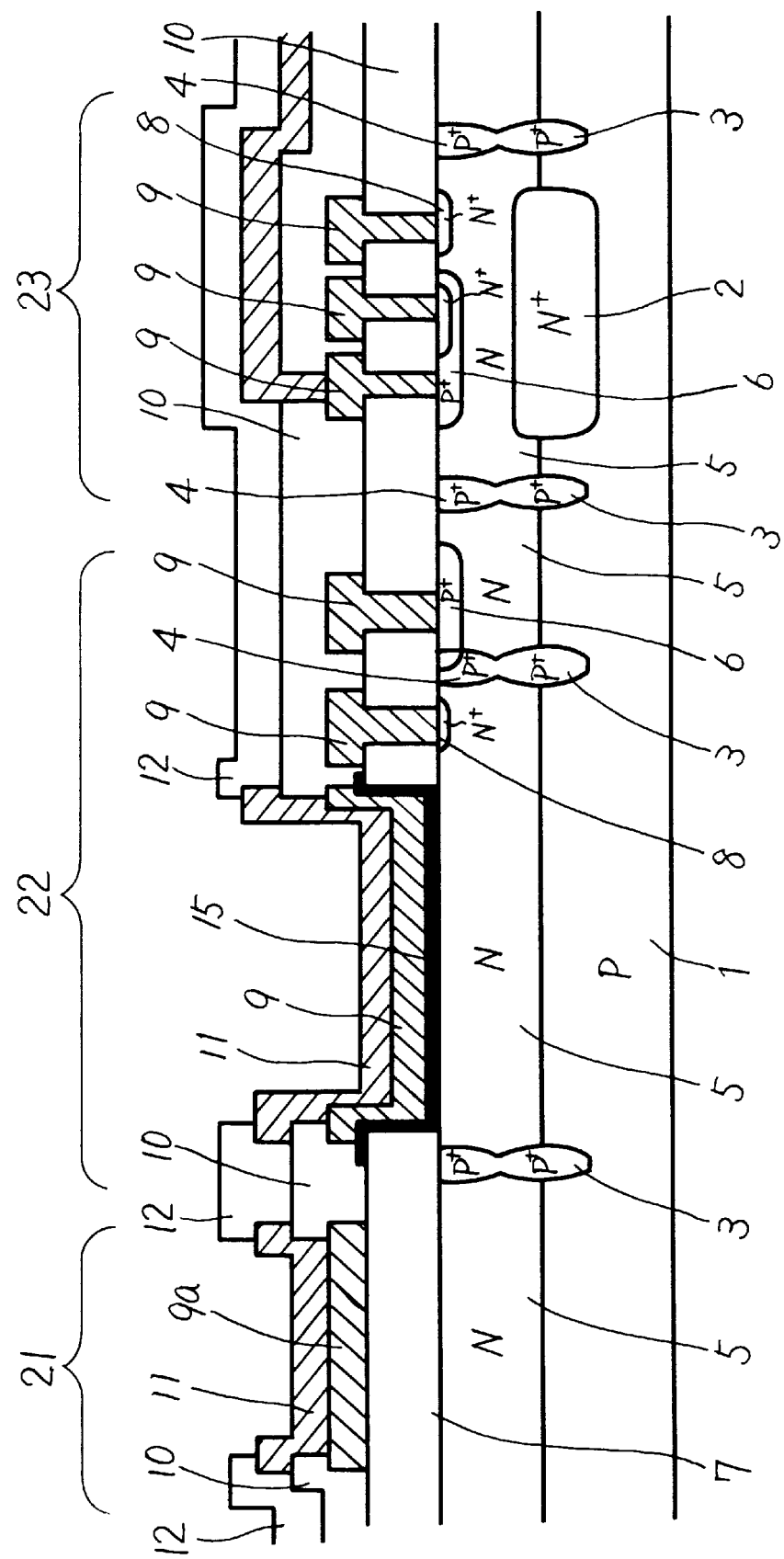

As compared with the fourth related art example shown in FIG. 16, the steps of forming the $Si_3N_4$ film 12 as the surface protecting film and of photolithography can be eliminated, and hence the element can be manufactured through smaller number of steps at a lower cost. Further, variation in thickness of the anti-reflection film can be suppressed.

As described above, by the present invention, humidity resistance of the photodetector element containing a circuit element can be improved and malfunction caused by light incident on the signal processing circuit portion can be prevented, without increasing cost. Further, since $Si_3N_4$ is used as the surface protecting film of the semiconductor substrate, a photodetector element containing a circuit element having superior humidity resistance can be provided. Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photodetector element containing a circuit element, comprising:
   a bonding pad portion for providing an electrical connection for elements operatively connected to the bonding pad portion;
   a photodetector element portion for detecting received light; and
   a signal processing circuit portion for processing a received signal; wherein
   said photodetector element portion and said signal processing circuit portion have a surface protecting insulating film;
   said bonding pad portion and said signal processing circuit portion each having multi-metals with at least one anti-corrosion metal portion.

2. The photodetector element containing a circuit element according to claim 1, further comprising:
   a light emitting element formed on said bonding pad portion.

3. The photodetector element containing a circuit element according to claim 1, wherein
   said anti-corrosion metal portion at said signal processing circuit portion interconnects said signal processing circuit portion.

4. The photodetector element containing a circuit element according to claim 1, wherein
   said photodetector element portion has an anti-reflection film.

5. The photodetector element containing a circuit element according to claim 1, wherein
   said surface protecting insulating film is resistant to the effects of humidity, so that humidity will not corrode metal covered by said protecting insulating film.

6. The photodetector element containing a circuit element according to claim 5, wherein
   said surface protecting insulating film includes SiN.

7. The photodetector element containing a circuit element according to claim 1, wherein
   said anti-corrosion metal portion is formed of gold.

8. The photodetector element containing a circuit element according to claim 1, wherein
   said anti-corrosion metal portion at said bonding pad portion is electrically connected to a metal layer with an interposed alloy portion between the metal layer and the anti-corrosion metal layer.

9. The photodetector element containing a circuit element according to claim 1, wherein
   said anti-corrosion metal portion at said signal processing circuit portion is formed above said surface protecting insulating film with an alloy portion interposed between said surface protecting insulating film and said anti-corrosion metal layer.

10. The photodetector element containing a circuit element according to claim 6, wherein
    said surface protecting insulating film is $Si_3N_4$.

11. The photodetector element containing a circuit element according to claim 1, wherein said bonding pad portion is provided by an anticorrosion metal portion formed on a metal layer formed on a semiconductor substrate with an insulating layer interposed between the semiconductor substrate and the metal layer.

12. The photodetector element containing a circuit element according to claim 11, wherein,
    the anticorrosion metal portion consists of gold formed on the metal layer at the bonding pad portion with a titanium tungsten alloy portion interposed.

13. The photodetector element containing a circuit element according to claim 11, wherein,
    said metal layer consists of aluminum.

14. The photodetector element containing a circuit element according to claim 3, wherein,
    said interconnection is uncovered by a protection film.

* * * * *